(12) United States Patent
Chapman et al.

(10) Patent No.: US 8,489,958 B2
(45) Date of Patent: Jul. 16, 2013

(54) DOCSIS MAC-PHY DOWNSTREAM CONVERGENCE LAYER

(75) Inventors: John T. Chapman, Laguna Niguel, CA (US); Alon S. Bernstein, Monte Sereno, CA (US)

(73) Assignee: Cisco Technology, Inc., San Jose, CA (US)

( * ) Notice: Subject to any disclaimer, the term of this patent is extended or adjusted under 35 U.S.C. 154(b) by 449 days.

(21) Appl. No.: 12/917,810

(22) Filed: Nov. 2, 2010

(65) Prior Publication Data

US 2011/0107172 A1 May 5, 2011

Related U.S. Application Data

(60) Provisional application No. 61/257,659, filed on Nov. 3, 2009.

(51) Int. Cl.
*H03M 11/00* (2006.01)

(52) U.S. Cl.
USPC .............................. 714/752; 370/503; 725/111

(58) Field of Classification Search
None
See application file for complete search history.

(56) References Cited

U.S. PATENT DOCUMENTS

| 6,459,703 B1 * | 10/2002 | Grimwood et al. ............ 370/442 |
| 6,970,504 B1 | 11/2005 | Kranawetter et al. |
| 7,250,987 B2 | 7/2007 | Goyal et al. |
| 2007/0097907 A1 * | 5/2007 | Cummings ..................... 370/329 |
| 2007/0133588 A1 * | 6/2007 | Kwon et al. .................... 370/431 |
| 2007/0195817 A1 * | 8/2007 | Denney et al. ................ 370/468 |
| 2011/0185263 A1 * | 7/2011 | Chapman et al. ............. 714/776 |

OTHER PUBLICATIONS

Altera Corporation, White Paper "Versatile Digital QAM Modulator", Jan. 2006, pp. 1-8.
ETSI EN 300 744 V1.5.1 (Jun. 2004), European Standard (Telecommunications series), pp. 1-64.

* cited by examiner

*Primary Examiner* — Gabriel Chu
(74) *Attorney, Agent, or Firm* — Edell, Shapiro & Finnan, LLC

(57) ABSTRACT

Techniques are provided herein for transmitting data across multiple carriers using Motion Picture Experts Group (MPEG) Transport Stream (TS) packet multiplexing. At a processing device coupled to at least one subscriber device data associated with the at least one subscriber device are received. The data are encapsulated into MPEG-TS packets, where the MPEG-TS packet headers identify a single data channel for the at least one subscriber device. The MPEG-TS packets are multiplexed across a plurality of radio-frequency (RF) carriers for transmission, and the MPEG-TS packets are transmitted using the plurality of RF carriers. Each of the plurality of RF carriers have the same RF modulation, use the same symbol rate, and are driven by the same clock such that the carriers are synchronous. Techniques are also provided recover the data at the subscriber device.

22 Claims, 6 Drawing Sheets

DOCSIS MAC-PHY DOWNSTREAM CONVERGENCE LAYER

CROSS REFERENCE TO RELATED APPLICATION

This application claims the benefit of U.S. Provisional Patent Application No. 61/257,659, filed Nov. 3, 2009, the entirety of which is incorporated herein by reference.

TECHNICAL FIELD

The present disclosure relates generally to Data-Over-Cable Service Interface Specification (DOCSIS), and more specifically to using DOCSIS and Motion Picture Experts Group (MPEG) to send digital video and data over multiple radio-frequency (RF) carriers.

BACKGROUND

DOCSIS is a protocol that is used to send digital video and data from a hub or headend facility (HEF) to a cable modem (CM) at a customer premise. Digital video is a one-way or downstream application from the hub to the CM, e.g., a television program, while data services are two-way (downstream and upstream) applications, e.g., Internet Protocol (IP) web browsing or IP telephony. For downstream transport, both digital video and data are encapsulated using the DOCSIS and Motion Picture Experts Group (MPEG) protocols prior to transport. To preserve the integrity of video and data during transport error correction techniques are employed, e.g., forward error correction (FEC) and interleaving as defined in the International Telecommunication Union (ITU)-T J.83 standard.

DOCSIS version 3.0 expands DOCSIS capability beyond a single downstream RF carrier to multiple downstream RF carriers using a technique known as bonding or channel bonding. Channel bonding essentially uses packet multiplexing across two or more downstream RF carriers and is visible at layers 2-4 of the Open System Interconnection (OSI) Reference Model, e.g., TCP/UDP-IP-Ethernet/DOCSIS layers. When using a large number of carriers, e.g., 32, 64 or greater, DOCSIS 3.0 channel bonding becomes complex due to the DOCSIS signaling requirements and a quality of service (QoS) queue is required for each transmit queue on a per-carrier basis. In addition, the RF carriers and packets under DOCSIS 3.0 bonding are unsynchronized and require reassembly of the data stream at the CM.

BRIEF DESCRIPTION OF THE DRAWINGS

The features and advantages of DOCSIS media access control (MAC)-physical (PHY) convergence layer, or "MAC-PHY convergence layer" of the present disclosure will become apparent upon consideration of the following description of example embodiments thereof, particularly when taken in conjunction with the accompanying drawings wherein like reference numerals in the various figures are utilized to designate like components.

DESCRIPTION OF EXAMPLE EMBODIMENTS

Overview

Techniques are provided herein for transmitting data across multiple carriers using MPEG-TS packet multiplexing. At a processing device, e.g., a CMTS, coupled to at least one destination device, data associated with the at least one destination device are received. The data are encapsulated into MPEG-TS packets, where the MPEG-TS packet headers identify a single data channel for the at least one destination device. The MPEG-TS packets are multiplexed across a plurality of radio-frequency (RF) carriers for transmission and the MPEG-TS packets are transmitted using the plurality of RF carriers. Each of the plurality of RF carriers has the same RF modulation, uses the same symbol rate, and is driven by the same clock such that the carriers are synchronous. Techniques are also provided to recover the data at the destination device, e.g., a CM.

In DOCSIS 3.0, a CM should be able to support 4 receive channels per carrier and up to four RF carriers. The number of receive channels and carriers supported by CMs is expected to grow in the future. In addition to the QoS requirements of DOCSIS 3.0, when a service flow is assigned to a bonding group, i.e., multiple channels/carriers, the CMTS must assign the service flow to all channels of the bonding group. When a service flow with resequencing enabled is assigned to a downstream bonding group, the CMTS must label the packets of the service flow with a DOCSIS downstream service identifier (DSID) whose Resequencing Channel List (RCL) is set to contain all channels of the bonding group. The service flow must be resequenced or reassembled at the CM. The techniques described herein remove channel bonding from the upper protocol layers, i.e., the DOCSIS layer and above, down into the MPEG framing layer with synchronous channels thereby forming the MAC-PHY convergence layer, i.e., the MPEG framing layer is a sub layer between the MAC and PHY layers. Thus, the MPEG multiplexing, as described herein, is invisible to DOCSIS and resequencing is not required.

Example Embodiments

Figure 1:
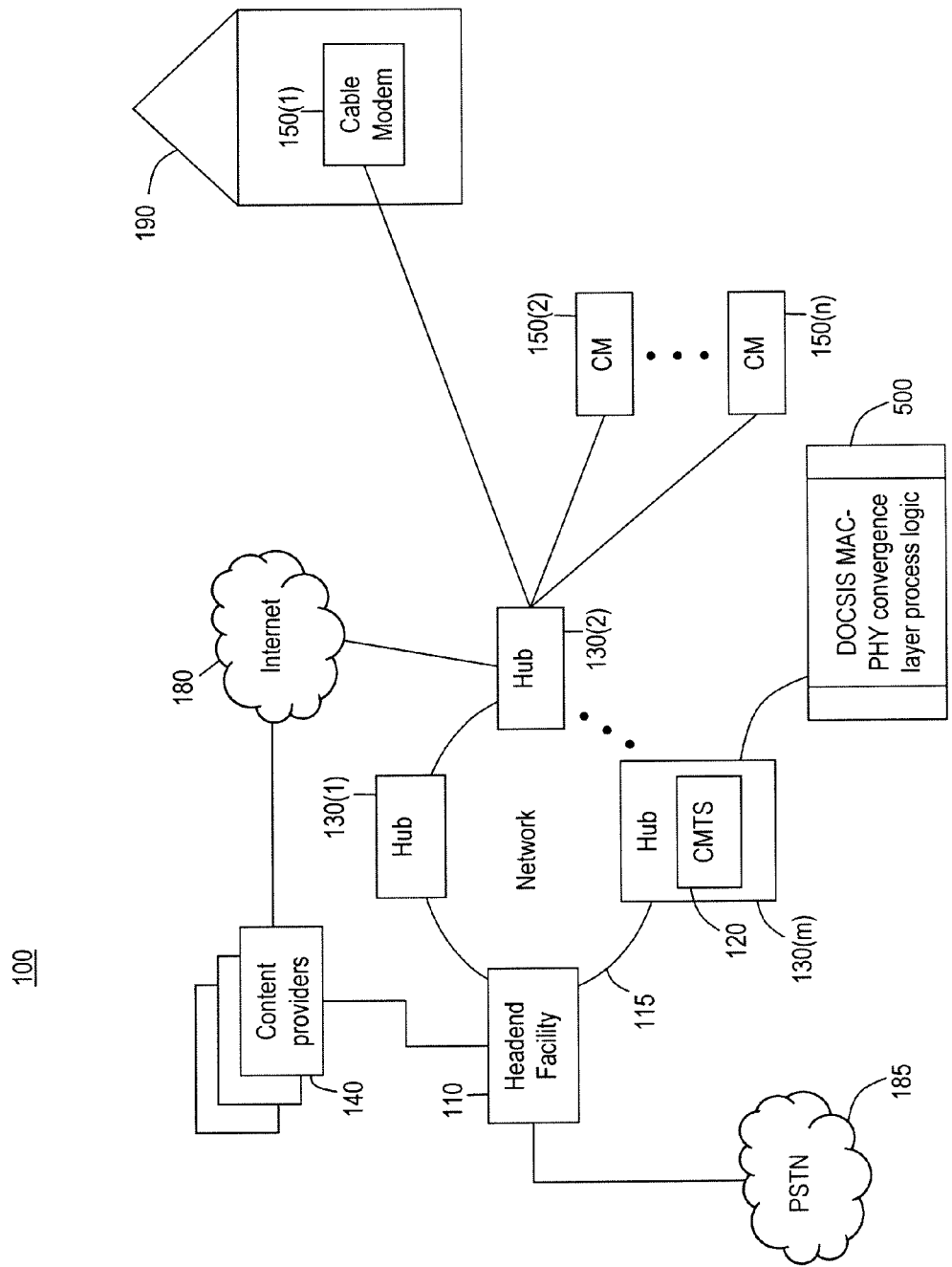
FIG. 1 is an example block diagram of a cable television distribution system employing MAC-PHY convergence layers.

Referring to FIG. 1, an example cable system or network 100 is shown that employs MAC-PHY convergence layers. Specifically, system 100 includes a headend facility (HEF) 110, a network 115, a plurality of hubs 130(1)-130(m), and a plurality a cable modems (CMs) 150(1)-150(n) with CM 150(1) residing in a customer premise 190. Hub 130(m) houses a CMTS 120 that is configured to implement DOCSIS MAC-PHY convergence layer process logic 500.

The HEF 110 is connected to various content providers 140 for providing media content (e.g., movies, television channels, etc.). The media content is distributed by HEF 110 to hubs 130 via network 115 (e.g. a synchronous optical network (SONET), synchronous digital hierarchy (SDH) network, or IP network). The content is further distributed by hubs 130 to plurality of CMs 150 in the form of conventional digital video or IP television.

Each of hubs 130 may also be connected to Internet 180 and public switched telephone network (PSTN) 185 (via HEF 110) for providing Internet and telephony services (e.g., to and from customer premise 190). Media content may also be distributed by content providers 140 via Internet 180. Each of the other hubs 130(1)-130(m−1) may also have a CMTS that implements the DOCSIS MAC-PHY convergence layer process logic or module 500. The process logic 500 will generally be described in connection with FIGS. 2-4 and in greater detail in connection with FIG. 5. Briefly, the process logic 500 allows FEC and interleaving techniques to be applied at the MPEG framing layers across multiple RF channels as opposed to FEC and interleaving being applied within a single RF channel.

The CMs 150(1)-150(n) act as a bridge between the cable network and the home network (not shown) for providing data services (e.g., Internet, telephony, IP television services, etc.). In the context of this disclosure, CM 150(1) is DOCSIS/EuroDOCSIS compliant (version 3.0 or greater). DOCSIS 3.0 implements a DSID that allows a service provider to further distinguish content. Content delivered to CM 150(1) may be labeled with a unique DSID. CM 150(1) is informed of the DSID and filters content based on the DSID (i.e., CM 150(1) may ignore content not labeled with the target DSID). It will be appreciated that other CMs throughout system 100 may not be DOCSIS 3.0 compliant.

Figure 2:
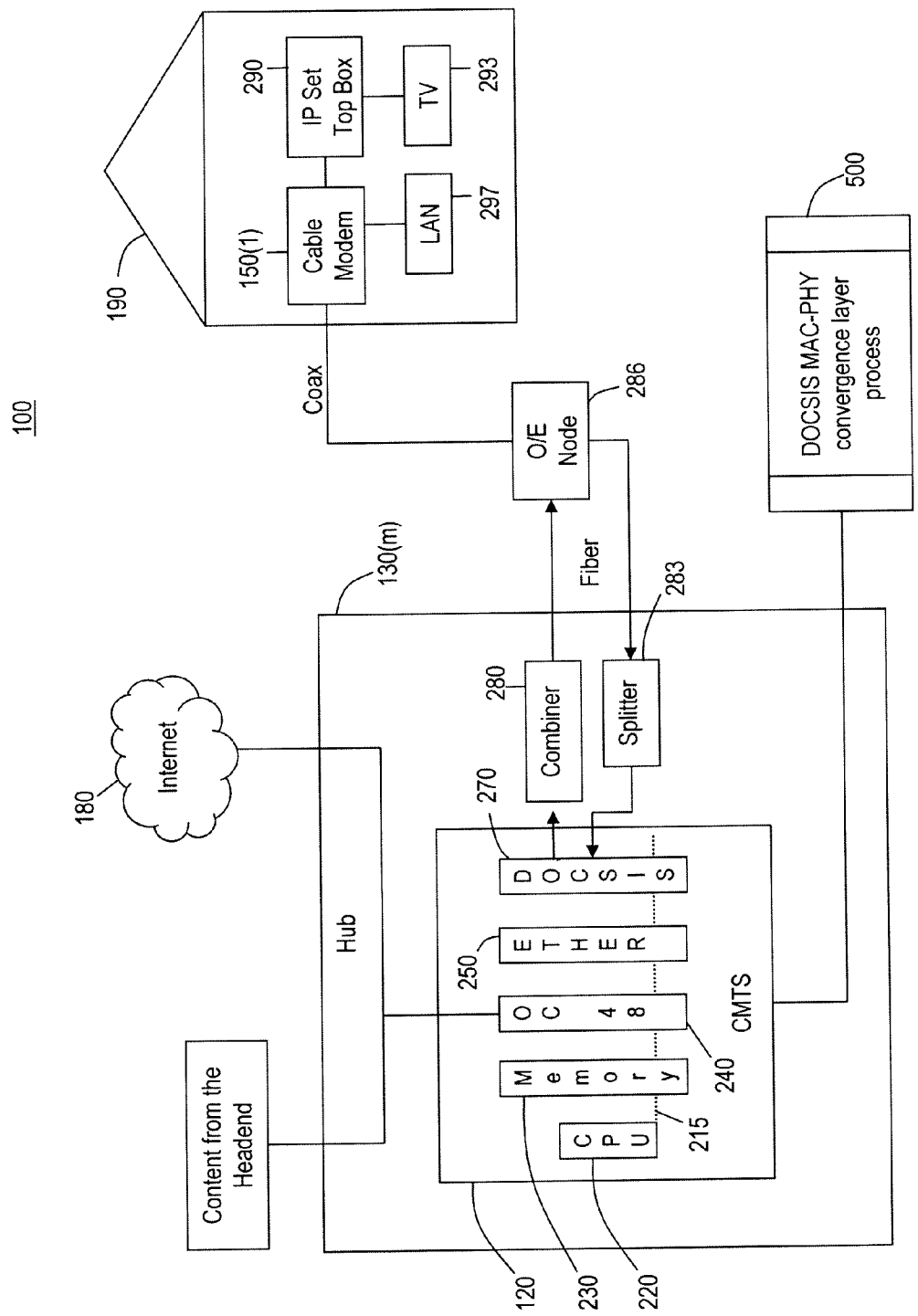
FIG. 2 is an example block diagram of a hub within the system of FIG. 1 with a cable modem termination system (CMTS) that is configured to employ MAC-PHY convergence layers.

Referring to FIG. 2, a portion of system 100 is shown in greater detail. In this example, customer premise 190 further houses an IP set top box 290 coupled to CM 150(1) and a television (TV) 293. CM 150(1) also connects to a local area network (LAN) 297. The LAN 297 may connect to other wired/wireless devices (e.g., personal computers (PCs) or personal data assistants (PDAs), etc.) and may serve as a gateway or access point through which additional PCs or consumer devices have access to data network facilities and Internet Protocol television services. IP set top box 290 receives media content over IP and de-encapsulates the media content. IP set top box 290 further decrypts and decodes the media content to produce analog video (e.g., component video, composite video, etc.) and analog audio, or digital video/audio (e.g., digital video interface (DVI) signals) for transmission to TV 293.

Hub 130(m) further contains a combiner 280 and a splitter 283. The combiner 280 combines various analog and digital signals for transport to customer premise 190 via an optical/electrical (O/E) node 286. The splitter 283 splits the signal coming from O/E node 286 into various components. O/E node 286 communicates via optical fiber to hub 130(m) and via coaxial (coax) cable to customer premise 190 in a hybrid fiber coax (HFC) network. O/E node 286 may reside anywhere between hub 130(m) and customer premise 190, or alternatively, coax may connect hub 130(m) to customer premise 190 without using optical fiber.

The coax cable may be split by a splitter (not shown) at customer premise 190 and routed to other set top boxes including legacy set top boxes that may not be IP capable. These legacy set top boxes may be distributed throughout system 100 and affect available bandwidth within the system. For example, a legacy set top box may not be able to decode an MPEG-4 AVC video stream which requires about half the bandwidth of an MPEG-2 video stream.

The CMTS 120 is used to provide high speed data services including cable Internet, voice over IP (VoIP), and Internet Protocol television services to various subscribers. CMTS 120 comprises a central processing unit (CPU) or data processing device 220 and a memory unit 230 for implementing process logic 500, as described below. The CMTS 120 may also house an optical carrier unit 240, Ethernet unit 250, and a DOCSIS 3.0 (or greater) unit 270. Memory unit 220 stores data and/or software or processor instructions that are executed to carry out the embodiments of the techniques described herein (e.g., for implementing convergence layer functions of DOCSIS MAC-PHY convergence layer process logic 500

The data processing device 220 is, for example, a microprocessor, a microcontroller, systems on a chip (SOCs), or other fixed or programmable logic. The data processing device 220 is also referred to herein simply as a processor. The memory 230 may be any form of random access memory (RAM) or other tangible (non-transitory) memory media that stores data or instructions used for the techniques described herein. The memory 230 may be separate or part of the processor 220. Instructions for performing the process logic 500 may be stored in the memory 230 for execution by the processor 220 such that when executed by the processor, causes the processor to perform the operations describe herein in connection with FIG. 4.

The functions of the processor 220 may be implemented by a processor or computer readable tangible (non-transitory) medium encoded with instructions or by logic encoded in one or more tangible media (e.g., embedded logic such as an application specific integrated circuit (ASIC), digital signal processor (DSP) instructions, software that is executed by a processor, etc.), wherein the memory 230 stores data used for the computations or functions described herein (and/or to store software or processor instructions that are executed to carry out the computations or functions described herein). Thus, functions of the process logic 500 may be implemented with fixed logic or programmable logic (e.g., software or computer instructions executed by a processor or field programmable gate array (FPGA)).

Units 220-270 may be circuit or line cards with embedded software or firmware that plug into a common chassis and communicate over a common bus 215 (e.g., a peripheral component interconnect (PCI) bus), or units 220-270 may be implemented by any conventional or other computer systems preferably equipped with a processor, memories and/or internal or external communications devices (e.g., modem, network cards, etc.).

The firmware or software for units 220-270 may be updated locally or remotely using various networking components. In addition, the software for the present invention embodiments (e.g., for process logic 500, etc.) may be available on a recordable medium (e.g., magnetic, optical, floppy, DVD, CD, etc.), or in the form of a carrier wave or signal for downloading from a source via a communication medium (e.g., bulletin board, network, WAN, LAN, Intranet, Internet, File Transfer Protocol (FTP) server, etc.).

Optical carrier unit 240 may communicate with HEF 110 or Internet 180 over network 115 using one of various SONET, SDH, or other protocols, such as OC-48 or OC-192 (in the U.S. and Canada), and STM-16 or STM-64 (outside of the U.S. and Canada). Ethernet unit 250 is used for communication with local networking components (not shown). DOCSIS unit 270 is the CMTS 210 interface to CM 150(1) for digital data signals communicated between CMTS 210 and both the IP set top box 290 and LAN 297. Any hub in system 100 may include a CMTS provisioned to implement process logic 500 and may be configured in a manner similar to hub 130(m).

Figure 3:
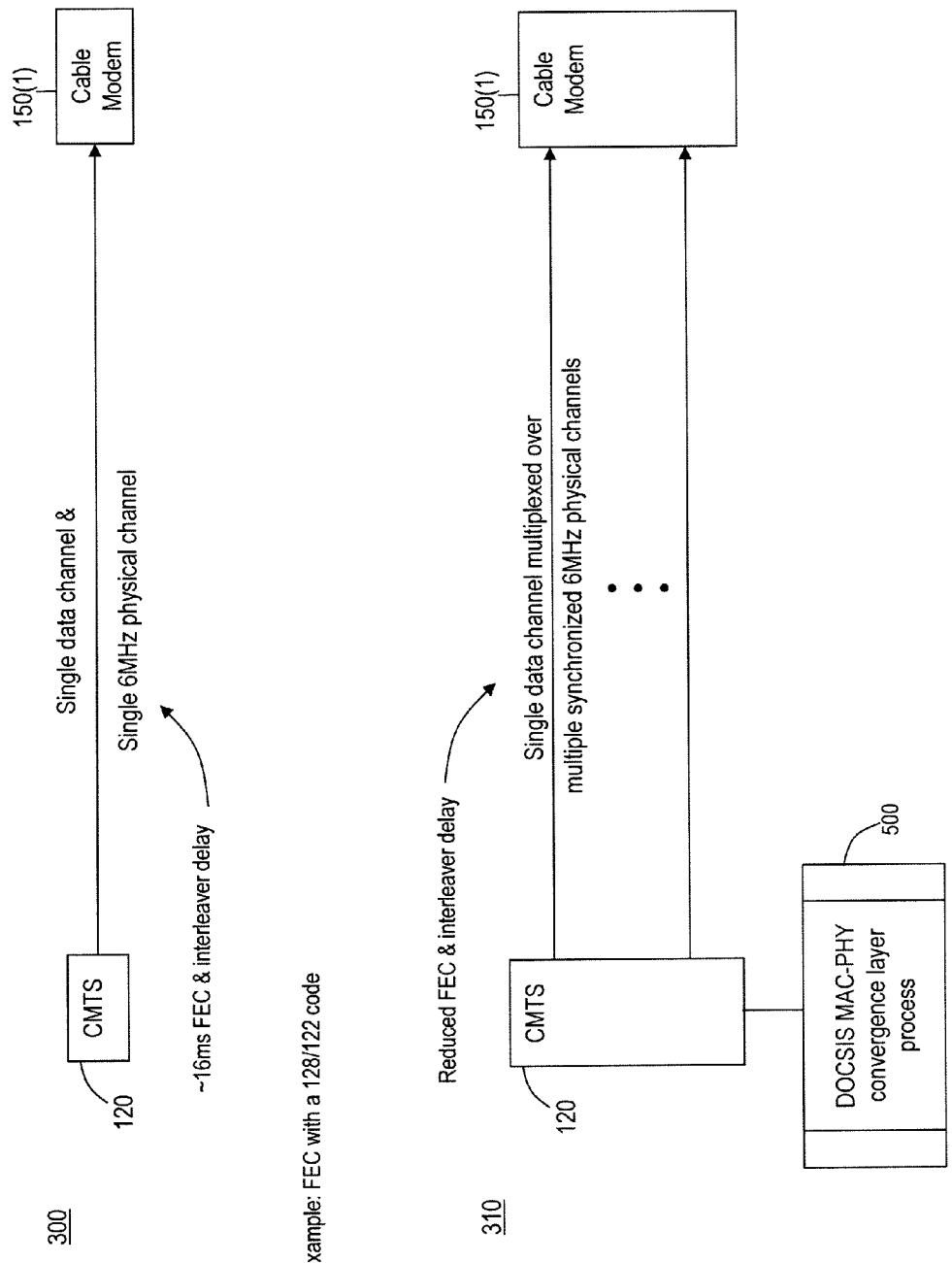
FIG. 3 is an example block diagram of a portion of a cable environment both before and after implementation of a MAC-PHY convergence layer.

Referring to FIG. 3, implementation of the DOCSIS MAC-PHY convergence layer is contrasted with conventional DOCSIS for a single data channel. At 300, a portion of system 100 is shown and comprises CMTS 120 (without module 500) and CM 150(1). Video and data are transmitted on a single data channel using a single physical channel, e.g., a 6-8 MHz wide quadrature amplitude modulator (QAM) channel. On normal MPEG-transport stream (TS) downstreams, data are interleaved at a depth that produces a 1 ms interleaver delay while in video it is preferred to interleave at a depth that produces 16 ms interleaver delay. This provides more protection from data corruption for video, but at a cost of additional delay. When mixing video and data over DOCSIS, a 16 ms delay is highly undesirable because it adds too much delay to voice over IP (VoIP) streams and to transport control protocol (TCP) sessions.

When data are transported to a CM, the application layer data are encapsulated into TCP/IP packets at the transport layer. At the data link layer, the TCP/IP packets become payload for a variable length Ethernet frame. Upon reaching a DOCSIS module, as described above, the Ethernet frames are further given a DOCSIS header with a DSID to become a DOCSIS frame with variable length. The DOCSIS frame is broken apart into 184 byte or less MPEG Transport Stream (TS) payloads. The payloads may be padded to bring the total to 184 bytes. The MPEG-TS packets have a header and FEC trailer that bring the MPEG-TS packets to a standard total of 204 bytes.

Interleaving may be performed on the MPEG-TS packets within the single RF channel to reduce the effects of error bursts. MPEG-TS interleavers use a predetermined interleaver depth to interleave bytes of MPEG-TS packets. For example, if an interleaver depth of 12 is used, 12 MPEG-TS packets are fed, one byte per packet on a rotational basis, into a buffer and transmitted. On the receive side all 12 packets must be received before complete de-interleaving may take place. Thus, an interleaver delay is introduce into the TS that is proportional to the interleaver depth when compared to the amount of time it would take to transmit single packet without interleaving. When channel bonding is used, these same MPEG-TS packets may be transmitted over multiple RF channels using multiple data channels. The CM decapsulates the MPEG-TS payloads and reassembles the DOCSIS frames and sends the application layer data to the target IP address.

In contrast, the techniques described herein can be used to transmit a single MPEG-TS packet from a stream of MPEG-TS packets over a single data channel, but the content of the single MPEG-TS packet is multiplexed over multiple physical channels, e.g., multiple QAM channels, as shown at 310. In alternate embodiments, data can be multiplexed across multiple subcarriers in an orthogonal frequency division multiplexing scheme. In addition to multiplexing across carriers, interleaving may also be performed across carriers, instead of within the QAM channel, to reduce interleaver delay. The cross-carrier scheme protects packets against loss due to frequency based noise. If there were a drop-out on a select number of carriers in the downstream, the dropped bytes could be recovered by FEC. By keeping the carrier interleaver delay to 1 ms and using interleaving across carriers, the equivalent protection for video can be achieved but at a fraction of the delay produced by prior DOCSIS techniques for video.

Figure 4A:
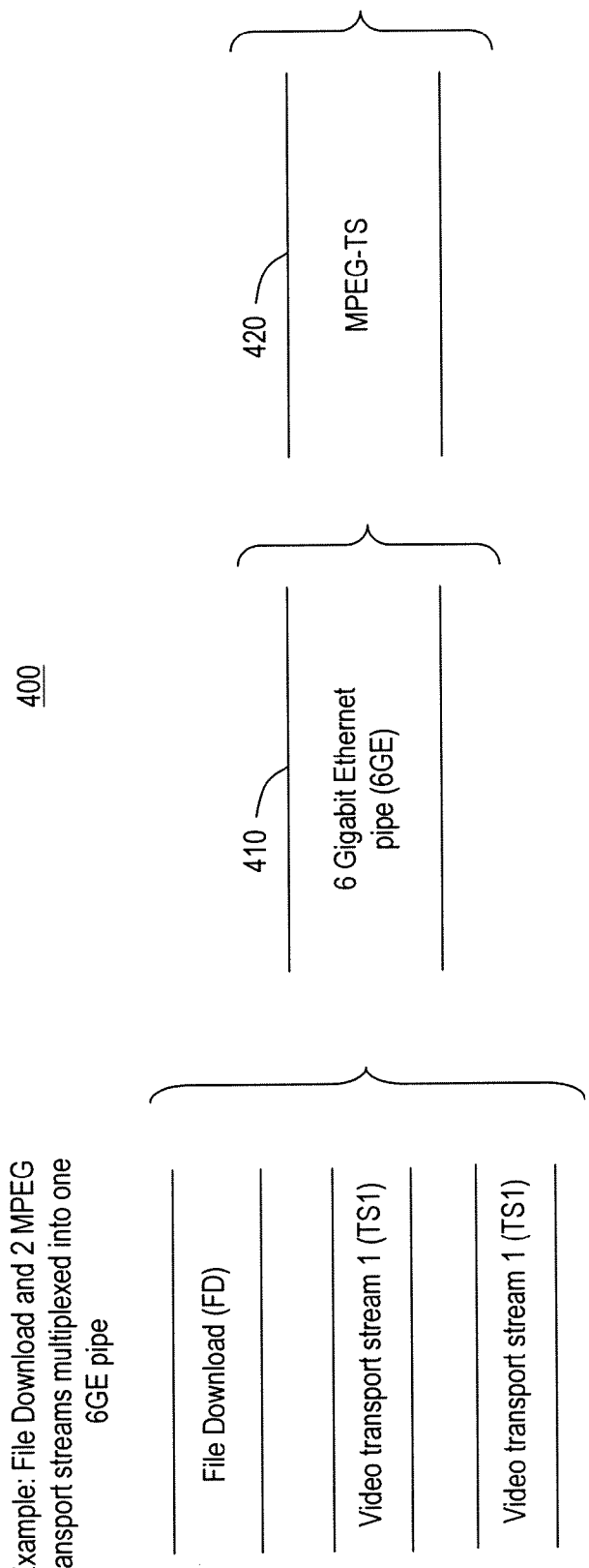
FIGS. 4a and 4b are an example diagrams illustrating the manner in which multiple data streams may be multiplexed via a MAC-PHY convergence layer.
Figure 4B:
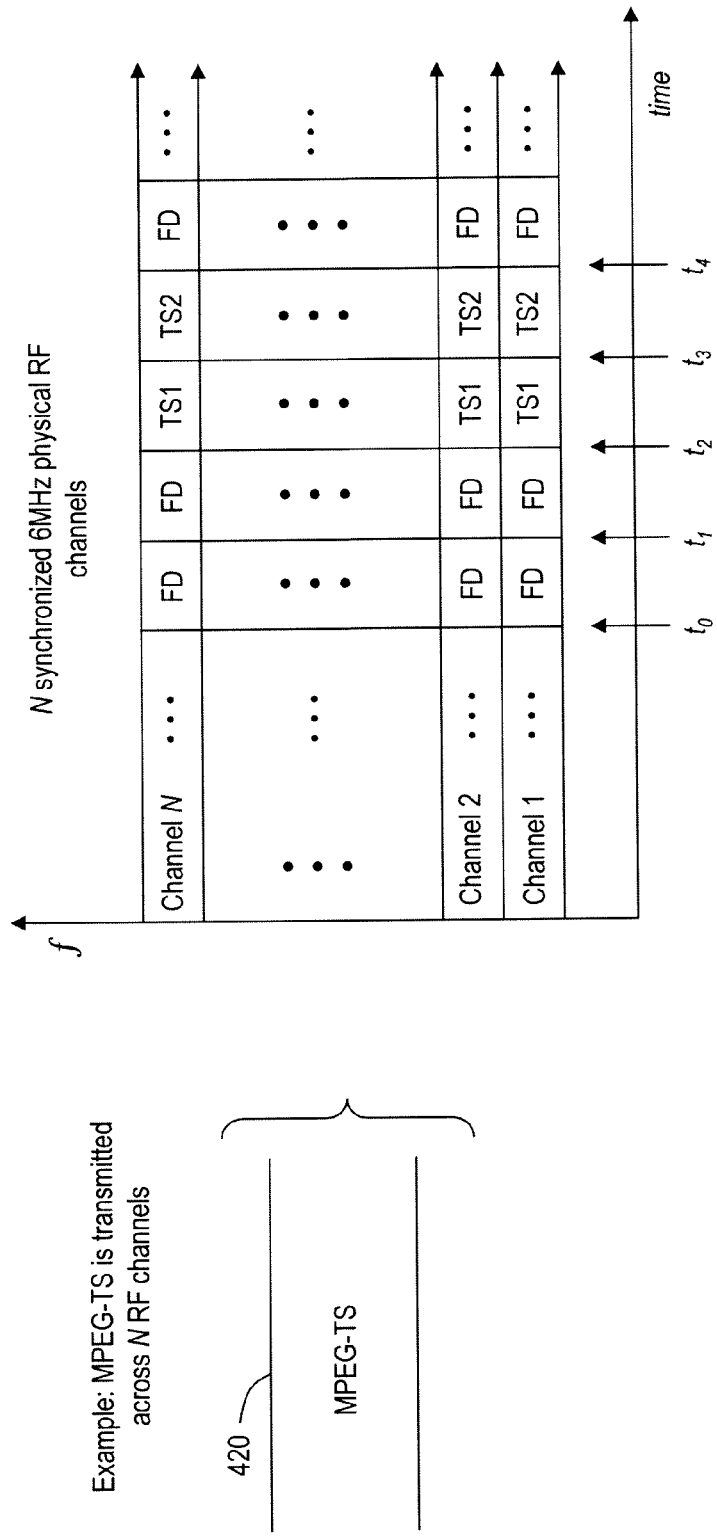

Referring to FIGS. 4a and 4b, example diagrams are shown that illustrate the manner in which multiple data streams may be multiplexed via a MAC-PHY convergence layer. At 400, data are received at a processing device, e.g., at a CMTS, that is in communication with a destination device, e.g., a CM. In this example, a file download (FD) and two video transport streams, TS1 and TS2, are received. The transport streams TS1 and TS2 are used to transport video, e.g., two different movies. The FD, TS1, and TS2 data are multiplexed into 6 gigabit Ethernet (6 GE) pipe 410 for downstream data transport, as shown. At 420, prior to transport the Ethernet frames associated with the 6 GE pipe are further encapsulated into an MPEG-TS.

At 430 in FIG. 4b, the MPEG-TS packets are laid down or striped across the RF channels according to a predetermined number of bytes, e.g., a 204 byte MPEG-TS packet may be laid down 1, 2, 4, 5, or 8 bytes at a time, or any other convenient or computationally efficient byte mechanism may be employed. Starting with channel 1, one or more bytes from the first FD packet is added to channel 1 at $t_0$. At the same time, at $t_0$, FD bytes are added to channels 2-N. The bytes are simultaneously transmitted and the process repeats at $t_1$. At $t_2$, bytes from TS1 packets are laid down on channels 1-N and simultaneously transmitted. At $t_3$, bytes from TS2 packets are laid down on channels 1-N and simultaneously transmitted. At $t_4$, the process returns to the FD packets and bytes from the corresponding FD packets are laid down on channels 1-N and simultaneously transmitted. In this example, header or other types of information are not specifically delineated.

For ease of illustration, the packets shown at 410 conveniently occupy all contiguous channels and a single time slot, e.g., the time slot from $t_0$ to $t_1$. However, the packets may be laid down in any channel order and in non-contiguous channels, e.g., a first packet may be placed on channel 14, the second on channel 21, and the third on channel 4, etc. In another example, the same packet may be transmitted over two RF channels for redundancy. The lay down process may accommodate break points at the Maximum Transmission Unit (MTU) or Protocol Data Unit (PDU) level. For example, an Ethernet PDU may be laid down across channels 1-8, a second Ethernet PDU on channels 9-16, TS1 packets on channels 17-21, a third Ethernet PDU on channels 22-32, and so on, all within a single time period or time slot, e.g., from $t_0$ to $t_1$. In addition, if a full PDU cannot be accommodated in a single time period then the PDU may be broken apart and transmitted in multiple time periods. Thus, a variety of multiplexing schemes may be employed using the approximately 158 6 MHz RF channels that are available on the DOCSIS 54 Mhz-1 GHz downstream spectrum.

Figure 5:
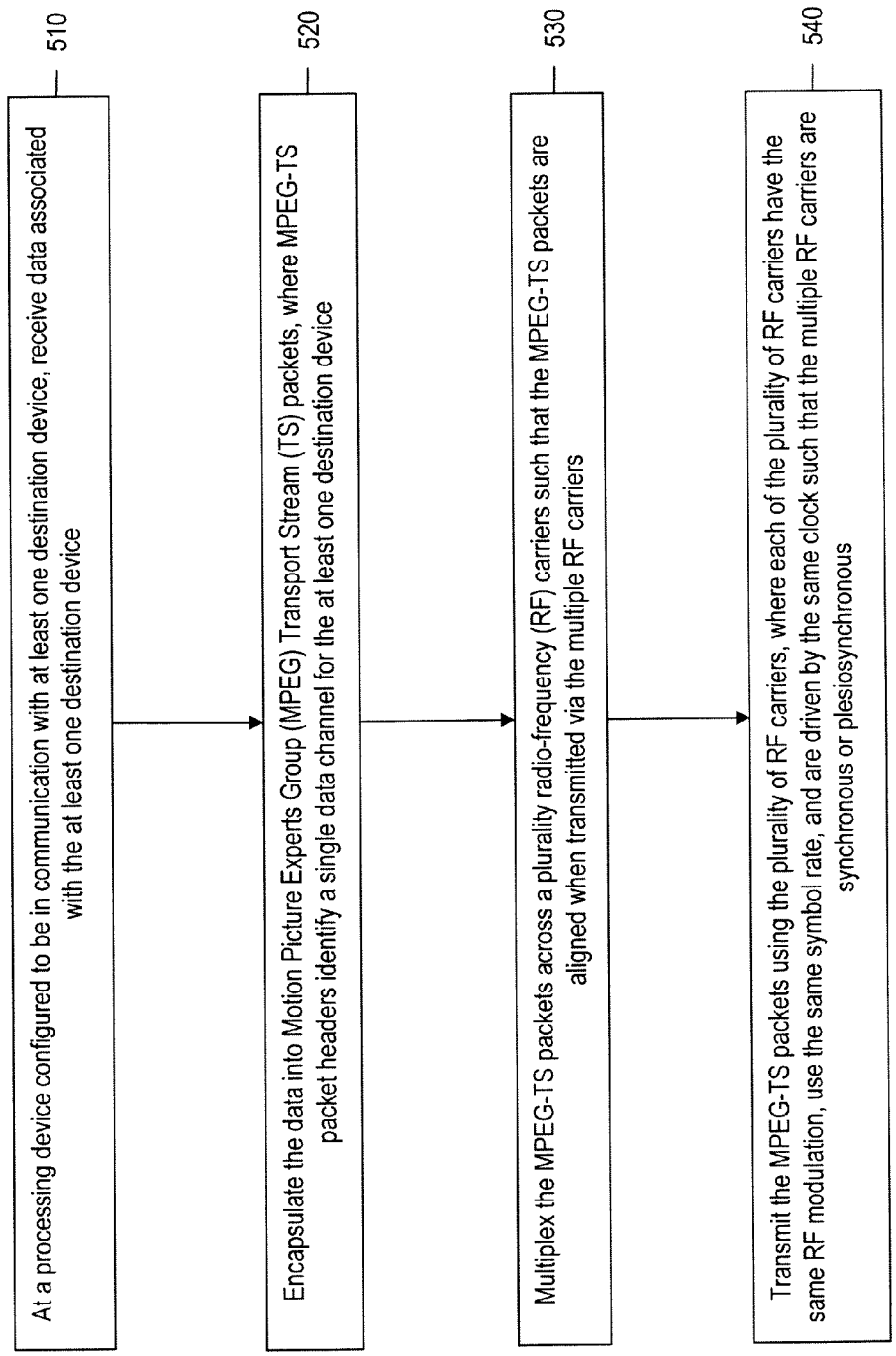
FIG. 5 is an example procedural flowchart illustrating the manner in which a MAC-PHY convergence layer may be implemented.

Turning now to FIG. 5, the DOCSIS MAC-PHY convergence layer process logic 500 will now be described. At 510, at a processing device, e.g., a CMTS, coupled to at least one destination device, e.g., a CM, data are received that is associated with the at least one destination device. The data may include both video, e.g., television programs, video on demand, etc., and other downstream data, e.g., Internet and IP telephony, intended for the CM. At 520, the data are encapsulated into an MPEG-TS packets for transmission, where the MPEG-TS packet headers identify a single data channel for the at least one subscriber device. At 530, the MPEG-TS packets are multiplexed across a plurality of RF carriers such that the MPEG-TS packets are aligned when transmitted via the multiple RF carriers.

To achieve multiplexing of MPEG-TS packets with interleaving across multiple carriers several ITU-T Recommendation J.83 operating considerations for implementing MAC-PHY convergence layers are as follows: all carriers have the same modulation scheme, use the same symbol rate, and are driven by the same clock or synchronized clocks. When interleaving, all carriers use the same interleaver depth. To facilitate multicarrier synchronization, it may be convenient for all carriers to come from the same chip or circuit. The same circuit scheme allows alignment of MPEG-TS packets and continuity count (CC) fields across carriers. As a result, all carriers are synchronous or plesiosynchronous, and the payloads of all the carriers are "time" aligned when transmitted. The multiple carriers need not be contiguous, as described above, however, the carriers may never the less be close in frequency or contiguous as a result of limited bandwidth of the CM receiver.

In addition an optimal block size may be computed for FEC and/or interleaving that provides the best protection against the loss of a carrier, e.g., the optimum block size is likely to be integer related to the number of carriers. In one example, if the number of carriers is 32, then for ease of alignment it may work out that a FEC block size of 128 (4*32, or a multiple of 32) would work better than, e.g., 108 which is not a multiple of 32. The FEC and interleaving may be accomplished within the MPEG-TS payload so that MPEG-TS headers can be used for signaling and for alignment. Alternatively, the cross-carrier FEC and interleaver could attach to the FEC framing of the carriers. For example, alignment across carriers could be placed at the beginning of the FEC blocks. Then cross-carrier FEC could be directly above the per-carrier FEC. This technique may also completely displace or obviate the need for per-carrier FEC.

An alternative implementation is to not use FEC and interleaving within a carrier and to use only across carrier FEC and interleaving, i.e., frequency interleaving. To make this implementation possible, a separate single carrier that carries the MPEG-TS signaling for describing the multi-carrier frame may be needed. For interleaving to be effective, the FEC block should be spaced out such that a noise disruption will only affect a small portion of the FEC block. For example, in the ITU-T Recommendation J.83 Annex B, for a Reed-Solomon Block of (188, 204), up to 8 bytes can be corrected (e.g., k=8) within a 188 byte MPEG-TS packet with 16 bytes of redundant payload. For frequency interleaving (across carriers), the block should be distributed across the carriers sufficiently so that noise will not destroy it. If the noise was at single frequency, then no more than 8 bytes (in this example) can occur at that frequency, either sequentially at one time, or in total if the block wraps around to the same frequency.

In summary, the frequency interleaver must balance out the number of carriers with FEC Block Size, the number of bytes placed per carrier at one time interval while striping across carriers, and the total number of bytes. In one example, if 32 carriers are used and the number of bytes per carrier is 8, then the total block size can be up to 8*32 or 256 bytes. Since this is greater than a Reed-Solomon block of 204 bytes, a standard FEC block size of 204 should work. For 25 carriers or less, with 8 bytes per carrier (204/8=25.5), a FEC block size less than 204 is used.

When encapsulating and multiplexing the data, framing information and methods could include using a MAC-PHY convergence layer downstream that has a different MPEG program ID (PID) than DOCSIS. The bytes of data are striped across the carriers in MPEG-TS blocks and the MPEG-TS packets are kept aligned by the CC (continuity counter) field along with the MAC-PHY PID, i.e., bytes of data are laid down and read off column by column. Any MPEG-TS packet with a different PID is skipped. Thus, legacy DOCSIS 3.0 downstream can co-exist with a MAC-PHY convergence layer downstream by virtue of MPEG multiplexing.

Referring again to FIG. 5, at 540, the MPEG-TS packets are transmitted using the plurality of RF carriers. Each of the plurality of RF carriers has the same RF modulation, uses the same symbol rate, and is driven by the same clock such that the carriers are synchronous or plesiosynchronous, as described above. MAC-PHY convergence layer techniques are independent of the choice and size of the frequency spectrum. However, the implementation may be influenced by the frequency spectrum choice. The MAC-PHY convergence layer process applies to a minimum of 2 downstream channels and can apply to any number of downstream channels.

Typical usage choices, based upon ITU-T Recommendation J.83 Annex B 6 MHz carriers may be 24 to 32 carriers located anywhere within a spectrum of 54 to 1000 GHz, 158 carriers located from 54 MHz to 1000 MHz, or 128 carriers from 240 to 1000 MHz in a DOCSIS high split system. Using current techniques, approximately 24 to 32 carriers are needed to achieve 1 Gbps downstream data rates. Carriers above 1 GHz may also be used and a channel block may be carved out for Multimedia Over Coax Alliance (MOCA) applications. MAC-PHY convergence layer applies to ITU-T Recommendation J.83 Annex A systems with 8 MHz carriers (European) and to Annex C systems (Japanese). The maximum number of carriers is limited by the number of receivers in a CM.

The DOCSIS MAC-PHY convergence layer process logic 500 may use the entire channel line-up, e.g., 2 to 158 channels as describe above. Thus, any size Ethernet link may be built. The payload could be across 2 to 158 channels (or more) in width. The payload inside of the MPEG-TS structure is still a DOCSIS frame. Multiple independent GE links are allowed on the downstream path using channels that are non-overlapping, i.e., the GE links do not share carriers. Alternatively, the GE links may share carriers within the MAC-PHY convergence layer process 500. An Ethernet channel might also share a carrier with signaling traffic.

The built-in signaling features of MPEG may be used when MPEG signaling is employed. For example, one or more carriers contain a data table or other information that is generated by the CMTS which lists the order of striping across the carriers. The table is on a signaling program ID (PID), e.g., a PID of 0/1 or a PID unique to DOCSIS. The PID table may contain multiplexing information or parameters, e.g., an instance ID of the DOCSIS MAC-PHY downstream convergence layer, the carriers associated with the instance, the order of carriers, the PID value, FEC on/off information and block size, and interleaver on/off information and depth values.

The MAC-PHY downstream PID may be dynamically assigned, there may be multiple PID assignments for multiple channels, and there may be more than one MAC-PHY downstream PID. There may be multiple MAC-PHY downstream data channels. Each MAC-PHY downstream data channel is assigned a unique PID. In one example, a downstream spectrum could be allocated for 4 GE links, with each GE link assigned 32 channels. Each Ethernet link would have its own PID, or the entire downstream could be one large GE pipe. The PID usage could be either integrated into the MPEG-TS PID table structure or implemented as an independent ID. If integrated into the PID table, the Program Association Table (PAT) would contain an entry for a PMT (Program Map Table) that would provide a PID that described the MAC-PHY downstream convergence layer parameters. That PID would then contain the PIDs used for the data channel. This table could/would also include the PID used for the MPEG-TS Timing Packet. If the PID is not integrated, there could be a pre-assigned PID that could be searched for that describes the MAC-PHY downstream convergence layer operation or convergence layer parameters.

On the CM side, the CM initiates the following example sequence on startup in order to acquire the MAC-PHY downstream convergence layer traffic: 1) scan the downstream for a QAM carrier; 2) when the first QAM carrier is found, lock onto the QAM signal; 3) decode the FEC and de-interleave the data; 4) decode an MPEG-TS frame; 5) decode an MPEG-TS network timing packet; and check the PID 0/1 for channel information. Based on the channel information 6) the CM retunes, if necessary, to the carriers in each MAC-PHY downstream convergence group. Thereafter, the CM 7) decodes FEC and de-interleaves that data in each carrier; 8) decodes MPEG-TS packet structure in each carrier; 9) decodes FEC and de-interleaves across carriers, if present, or could occur prior to MPEG-TS sync; and 10) uses the information from the signaling PID to recover the DOCSIS frames.

When the CMTS is a modular-CMTS (M-CMTS), the downstream physical layer is removed from the CMTS and placed into an Edge QAM (EQAM). Several options for implementing MAC-PHY convergence layer for an M-CMTS are available. A first option uses only one EQAM port. With this option, 100% of the data channel originates from one MAC layer complex on the M-CMTS and goes to one PHY complex in the EQAM. The EQAM will buffer across the downstream external PHY interface (e.g., a DOCSIS Downstream External-PHY Interface (DEPI) link. The EQAM ensures that the data are put onto the downstream PHY correctly and fully aligned. A second option uses multiple PHY ports located on the same assembly. The PHY ports would use a common framing engine which would align the MPEG-TS frames. The M-CMTS can deliver Ethernet/DEPI packets and the EQAM will stripe the data across carriers.

A third option uses multiple PHY ports on separate assemblies in the EQAM. The DOCSIS timing interface (DTI) can be used to synchronize the PHY ports together. The PHY ports can be configured to sync on a common DTI boundary such as when the lower order digits are all zeros. One issue with using separate assemblies is that the PHY cannot stripe packets across the entire data channel because the two PHYs are separate. A way around this issue is to perform the striping process in the MAC complex. The MAC assembly could be synchronized to an earlier frame pulse (derived from DTI) if needed. This solution does not easily allow the PHY to insert signaling or null MPEG-TS packets. The MAC may insert a certain number of MPEG-TS null packets for the PHY, so that the PHY could insert signaling. Null packet insertion may be configured on a per channel basis.

At the CM receiver the EQAM and M-CMTS ensure alignment across carriers. Thus, there is no timing skew across the channels and no buffering is required at the CM to remove the skew. As a result, downstream delays are kept to a minimum.

There are several advantages of MAC-PHY downstream convergence over standard DOCSIS 3.0. First, the MAC-PHY downstream convergence layer has much lower latency. If DOCSIS 3.0 drops a downstream packet, the latency can be as high as 28 ms. The MAC-PHY downstream convergence layer always has ~1 ms latency (presuming a 1 ms interleaver) regardless of whether or not a packet is dropped. The lower latency is achieved by striping packets across carriers instead of within a carrier and using a lower interleaver delay per carrier (because the FEC and interleaving are across carriers). Second, aligning of the MPEG-TS packets at the CMTS relieves the CM from buffering and deskewing packets, i.e., no buffering is required at the CM thereby reducing memory requirements. Third, fewer transmit queues are needed at the CMTS. MAC-PHY downstream convergence can have one set of output Quality of Service (QoS) queues that support the one data channel rather than a set of QoS queues per carrier. For example, for a 128 carrier, 5 Gbps system, MAC-PHY downstream convergence may use 8 transmit queues while DOCSIS 3.0 would use 8*128=1024 queues. Lastly, built in IEEE 1588 timing may be used for wireless endpoints.

From the foregoing description, it will be appreciated that embodiments described herein make available a novel method and apparatus for DOCSIS MAC-PHY convergence layers, wherein a system and method enable a cable system operator or multi system/service operators (MSOs) in cable system environment to reduce network latency while at the same time preserving the data integrity of digital video.

Having described preferred embodiments of a new and improved DOCSIS MAC-PHY convergence layer, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A method comprising:
at a processing device configured to be in communication with at least one destination device, receiving data associated with the at least one destination device;
encapsulating the data into Motion Picture Experts Group (MPEG) Transport System (TS) packets, wherein the MPEG-TS packet headers identify a single data channel for the at least one destination device;
multiplexing the MPEG-TS packets across a plurality of radio-frequency (RF) carriers such that the MPEG-TS packets are aligned when transmitted via the multiple RF carriers; and
transmitting the MPEG-TS packets using the plurality of RF carriers, wherein each of the plurality of RF carriers has the same RF modulation, uses the same symbol rate, and is driven by the same clock such that the multiple RF carriers are synchronous or plesiosynchronous.

2. The method of claim 1, further comprising interleaving the MPEG-TS packets across the plurality of RF carriers.

3. The method of claim 2, wherein interleaving comprises interleaving the MPEG-TS packets across the plurality of RF carriers using the same interleaver depth for each carrier.

4. The method of claim 1, further comprising performing forward error correction (FEC) on the data.

5. The method of claim 4, wherein performing FEC comprises performing FEC on the data within the MPEG-TS packets or across the plurality of carriers.

6. The method of claim 4, further comprising computing an FEC block size base on the number of the plurality of carriers.

7. The method of claim 1, further comprising:
generating information comprising multiplexing parameters for the plurality of carriers; and
transmitting the information on one of the plurality of carriers.

8. The method of claim 7, wherein generating information comprises generating a Motion Picture Experts Group (MPEG) program ID (PID) table.

9. The method of claim 1, further comprising:
at the at least one destination device, demultiplexing the MPEG-TS packets from across the plurality of RF carriers; and
recovering the data from the demultiplexed MPEG-TS packets.

10. An apparatus comprising:
a network interface configured to receive data for at least one destination device;
a processor configured to:
encapsulate the data into Motion Picture Experts Group (MPEG) Transport Stream (TS) packets, wherein the MPEG-TS packet headers identify a single data channel for the at least one destination device;

multiplex the MPEG-TS packets across a plurality of radio-frequency (RF) carriers such that the MPEG-TS packets are aligned when transmitted via the multiple RF carriers; and transmit the MPEG-TS packets using the plurality of RF carriers, wherein each of the plurality of RF carriers has the same RF modulation, uses the same symbol rate, and is driven by the same clock such that the multiple RF carriers are synchronous or plesiosynchronous.

11. The apparatus of claim 10, wherein the processor is further configured to interleave the MPEG-TS packets across the plurality of RF carriers using the same interleaver depth for each carrier.

12. The apparatus of claim 10, wherein the processor is further configured to perform forward error correction (FEC) on the data across the plurality of carriers.

13. The apparatus of claim 12, wherein the processor is further configured to compute an FEC block size base on the number of the plurality of carriers.

14. The apparatus of claim 10, wherein the processor is further configured to:

generate information comprising multiplexing parameters for the plurality of carriers; and transmit the information on one of the plurality of carriers.

15. The apparatus of claim 14, wherein the processor is configured to generate information comprising a Motion Picture Experts Group (MPEG) program ID (PID) table.

16. A system comprising the apparatus of claim 10, further comprising a destination device comprising a cable modem configured to:

demultiplex the MPEG-TS packets from across the plurality of RF carriers; and recover the data from the demultiplexed MPEG-TS packets.

17. A computer readable non-transitory medium storing instructions that, when executed by a processor, cause the processor to:

receive data for at least one destination device;

encapsulate the data into Motion Picture Experts Group (MPEG) Transport Stream (TS) packets, wherein the MPEG-TS packet headers identify a single data channel for the at least one destination device;

multiplex the MPEG-TS packets across a plurality of radio-frequency (RF) carriers such that the MPEG-TS packets are aligned when transmitted via the multiple RF carriers; and transmit the MPEG-TS packets using the plurality of RF carriers, wherein each of the plurality of RF carriers has the same RF modulation, uses the same symbol rate, and is driven by the same clock such that the multiple RF carriers are synchronous or plesiosynchronous.

18. The computer readable non-transitory medium of claim 17, further comprising instructions that, when executed by a processor, cause the processor to interleave the MPEG-TS packets across the plurality of RF carriers using the same interleaver depth for each carrier.

19. The computer readable non-transitory medium of claim 17, further comprising instructions that, when executed by a processor, cause the processor to perform forward error correction (FEC) on the data across the plurality of carriers.

20. The computer readable non-transitory medium of claim 19, further comprising instructions that, when executed by a processor, cause the processor to compute an FEC block size base on the number of the plurality of carriers.

21. The computer readable non-transitory medium of claim 17, further comprising instructions that, when executed by a processor, cause the processor to:

generate information comprising multiplexing parameters for the plurality of carriers; and transmit the information on one of the plurality of carriers.

22. The computer readable non-transitory medium of claim 21, wherein the instructions that generate comprise instructions that cause the processor to generate information comprising a Motion Picture Experts Group (MPEG) program ID (PID) table.

* * * * *